United States Patent
Villa et al.

(10) Patent No.: US 8,334,188 B2
(45) Date of Patent: Dec. 18, 2012

(54) PROCESS FOR MANUFACTURING A WAFER BY ANNEALING OF BURIED CHANNELS

(75) Inventors: Flavio Villa, Milan (IT); Gabriele Barlocchi, Cornaredo (IT); Pietro Corona, Rome (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 29 days.

(21) Appl. No.: 12/791,553

(22) Filed: Jun. 1, 2010

(65) Prior Publication Data
US 2010/0237459 A1    Sep. 23, 2010

Related U.S. Application Data

(60) Division of application No. 11/904,745, filed on Sep. 28, 2007, now Pat. No. 7,754,578, which is a continuation of application No. 10/327,702, filed on Dec. 20, 2002, now Pat. No. 7,294,536.

(30) Foreign Application Priority Data

Dec. 28, 2001 (EP) .................................. 01830820

(51) Int. Cl.
H01L 21/76 (2006.01)
(52) U.S. Cl. .................. 438/422; 257/E21.573
(58) Field of Classification Search .......... 438/422; 257/E21.573
See application file for complete search history.

(56) References Cited

U.S. PATENT DOCUMENTS

| | | | |
|---|---|---|---|
| 4,139,442 A | 2/1979 | Bondur et al. |
| 4,361,600 A | 11/1982 | Brown |
| 4,385,975 A | 5/1983 | Chu et al. |
| 4,704,186 A | 11/1987 | Jastrzebski |
| 4,845,048 A | 7/1989 | Tamaki et al. |
| 4,888,300 A | 12/1989 | Burton |
| 5,223,450 A | 6/1993 | Fujino et al. |
| 5,308,786 A | 5/1994 | Lur et al. |
| 5,438,015 A | 8/1995 | Lur |
| 5,747,377 A | 5/1998 | Wu |
| 5,804,491 A | 9/1998 | Ahn |
| 5,907,783 A | 5/1999 | Kim et al. |
| 6,093,330 A | 7/2000 | Chong et al. |
| 6,165,914 A | 12/2000 | Fang |
| 6,265,742 B1 | 7/2001 | Gruening et al. |
| 6,303,464 B1 | 10/2001 | Gaw et al. |
| 6,342,427 B1 | 1/2002 | Choi et al. |
| 6,383,924 B1 | 5/2002 | Farrar et al. |
| 6,506,658 B2 | 1/2003 | D'Arrigo et al. |
| 6,512,283 B2 | 1/2003 | Davies |

(Continued)

FOREIGN PATENT DOCUMENTS

EP    0223694 A1    5/1987
(Continued)

OTHER PUBLICATIONS

K.W. Guarini, et al., "Process Integration of Self-Assembled Polymer Templates into Silicon Nanofabrication", J. Vac. Sci. Technol. B 20(6), Nov./Dec. 2002, p. 2788.

(Continued)

Primary Examiner — Alexander Ghyka
Assistant Examiner — Stanetta Isaac
(74) Attorney, Agent, or Firm — Graybeal Jackson LLP

(57) ABSTRACT

A process for manufacturing an SOI wafer, including the steps of: forming, in a wafer of semiconductor material, cavities delimiting structures of semiconductor material; thinning out the structures through a thermal process; and completely oxidizing the structures.

17 Claims, 4 Drawing Sheets

U.S. PATENT DOCUMENTS

| | | |
|---|---|---|
| 6,518,147 B1 | 2/2003 | Villa et al. |
| 6,551,937 B2 | 4/2003 | Jun et al. |
| 6,551,944 B1 | 4/2003 | Fallica et al. |
| 6,570,217 B1 | 5/2003 | Sato et al. |
| 6,579,738 B2 | 6/2003 | Farrar et al. |
| 6,582,512 B2 | 6/2003 | Geusic et al. |
| 6,599,771 B2 | 7/2003 | Mashio et al. |
| 6,759,746 B1 | 7/2004 | Davies |
| 6,773,616 B1 | 8/2004 | Chen et al. |
| 6,790,751 B2 | 9/2004 | Tsuruta et al. |
| 7,019,364 B1 | 3/2006 | Sato et al. |
| 7,045,382 B2 | 5/2006 | Benzel et al. |
| 7,071,073 B2 | 7/2006 | Villa et al. |
| 2002/3018101 | 9/2003 | Geusic et al. |
| 2005/0037593 A1 | 2/2005 | Delpech et al. |

FOREIGN PATENT DOCUMENTS

| | | |
|---|---|---|
| EP | 0957515 A1 | 11/1999 |
| EP | 0996145 A1 | 4/2000 |
| EP | 1043770 A1 | 10/2000 |
| EP | 1067599 A1 | 1/2001 |
| EP | 1073112 A1 | 1/2001 |
| EP | 1324382 A1 | 7/2003 |
| JP | 57160142 | 12/1982 |
| JP | 60074452 | 4/1985 |
| WO | 02/078061 A2 | 10/2002 |

OTHER PUBLICATIONS

Tsunashima, et al., "A New Substrate Engineering Technique to Realize Silicon on Nothing (SON) Structure Utilizing Transformation of Sub-micron Trenches to Empty Space in Silicon (ESS) by Surface Migration", High Purity Silicon VI Proceedings of the Sixth International Symposium (Electrochemical Society Proceedings vol. 2000-17) (SPIE vol. 4218) Phoenix, AZ, USA, Oct. 22-27, 2000, pp. 532-545.

Sato, et al, "Micro-structure Transformation of Silicon: A Newly Developed Transformation Technology for Patterning Silicon Surfaces Using the Surface Migration of Silicon Atoms by Hydrogen Annealing" Japanese Journal of Applied Physics, Publication Office Japanese Journal of Applied Physics, Tokyo, Japan, vol. 39, No. 9A, Part 1, Sep. 2000, pp. 5033-5038.

Sato, et al., "A New Substrate Engineering for the Formation of Empty Space in Silicon (ESS) Induced by Silicon Surface Migration", IEEE 1999, 0/7803-5410-9/99, pp. 517-520.

Eruopean Search Report for 01830820.5, dated Jun. 20, 2002.

US 8,334,188 B2

PROCESS FOR MANUFACTURING A WAFER BY ANNEALING OF BURIED CHANNELS

PRIORITY CLAIM

The present application is a Divisional of U.S. patent application Ser. No. 11/904,745, filed Sep. 28, 2007 now U.S. Pat. No. 7,754,578, which is a continuation of U.S. patent application Ser. No. 10/327,702, filed Dec. 20, 2002, now issued U.S. Pat. No. 7,294,536, which application claims priority from European patent application No. 01830820.5, filed Dec. 28, 2001, and U.S. patent application Ser. No. 09/625,112, filed Jul. 25, 2000, now U.S. Pat. No. 6,518,147, issued Feb. 11, 2003, which applications are incorporated herein by reference in their entirety.

TECHNICAL FIELD

The present disclosure relates generally to semiconductor processing, and more particularly to a process for manufacturing an SOI wafer annealing and oxidation of buried channels.

BACKGROUND

As is known, according to a solution that is currently very widespread in the sector of the microelectronics industry, the substrate of integrated devices is obtained from monocrystalline silicon wafers. In recent years, as an alternative to wafers made of silicon alone, composite wafers have been proposed, namely the so called silicon-on-insulator (SOI) wafers, consisting of two silicon layers, one of which is thinner than the other, separated by a silicon dioxide layer.

However, manufacturing of SOI wafers entails some problems, especially as regards the complexity and cost of the process and the quality of the thinner silicon layer. In fact, this layer is designed to house both high-power and low-power electronic devices, and the presence of crystallographic defects may irreparably impair the efficiency of the devices.

One method for manufacturing SOI wafers that partially tackles the above problems is described in EP-A1 073 112, filed on 26 Jul. 1999 in the name of the present applicant and incorporated by reference.

This method envisages initially forming, in a substrate of semiconductor material, for example monocrystalline silicon, a plurality of trenches which are substantially parallel and are separated from one another by silicon partition walls. In order to open the trenches, the substrate is anisotropically etched using a hard mask, which comprises, for example, a pad oxide layer and a silicon nitride layer.

Subsequently, by isotropically etching silicon, the trenches are widened so as to thin out the partition walls and form cavities which extend beneath the surface of the substrate, which, at this stage, is still protected by the hard mask.

The cavities are then lined with an inhibiting silicon dioxide layer, and the hard mask is removed, thus leaving the surface of the substrate uncovered.

Next, an epitaxial growth is carried out. In this step, the silicon grows on top of the substrate and expands laterally so as to form a uniform epitaxial layer that covers the entrance of the cavities. However, the inhibiting layer prevents silicon from growing inside the cavities, which thus are not filled and form buried channels.

Using a second anisotropic etch, connection trenches are opened, which have a depth such as to reach the cavities. Through the connection trenches, a thermal oxidation step is then performed, so that the partition walls separating the cavities are completely oxidized and the cavities are filled with silicon dioxide. Thereby, a continuous insulating region is formed, which separates the substrate and the epitaxial layer.

The process taught in the above mentioned patent application yields high quality SOI wafers, above all as regards crystallographic properties of the epitaxial layer, but has some limitations.

In fact, the processing steps required for forming the insulating region are numerous and complex and render the manufacturing of the wafers costly. First, during isotropic etching for widening the trenches and forming the cavities, the surface of the substrate must be protected, in particular with the hard mask. The formation of this mask, however, requires at least one oxidation step, one silicon nitride layer deposition step, and one definition step using a further resist mask. The hard mask must moreover be removed through further special steps.

Second, before carrying out the epitaxial growth, the cavities must be lined with the inhibiting layer; otherwise, in fact, the partition walls would get thicker and subsequently could no longer be oxidized completely. In addition, it is necessary to calibrate with precision the width of the inhibiting layer, which is partially removed during removal of the hard mask.

SUMMARY

Therefore, an embodiment of the present disclosure is a process that overcomes the drawbacks of the manufacturing process described above.

BRIEF DESCRIPTION OF THE DRAWINGS

For a better understanding of the present disclosure, a preferred embodiment thereof is now described, purely as a non-limiting example, with reference to the attached drawings, wherein.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure as defined by the appended claims. Thus, the present disclosure is not intended to be limited to the embodiments shown, but is to be accorded the widest scope consistent with the principles and features disclosed herein.

Figure 1:
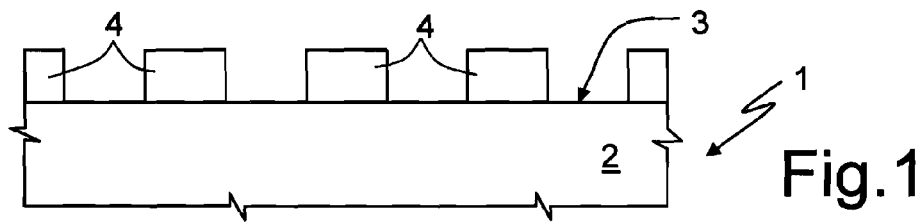
FIGS. 1-4 are cross-sectional views of a wafer of semiconductor material in successive manufacturing steps, according to an embodiment of the present disclosure.

In FIG. 1, a wafer of semiconductor material, for example monocrystalline silicon, is designated by 1 and comprises a substrate 2. In an initial step of the process according to an embodiment of the disclosure, a resist layer is deposited directly on top of a face 3 of wafer 1 and is defined to form a mask 4.

Figure 2:
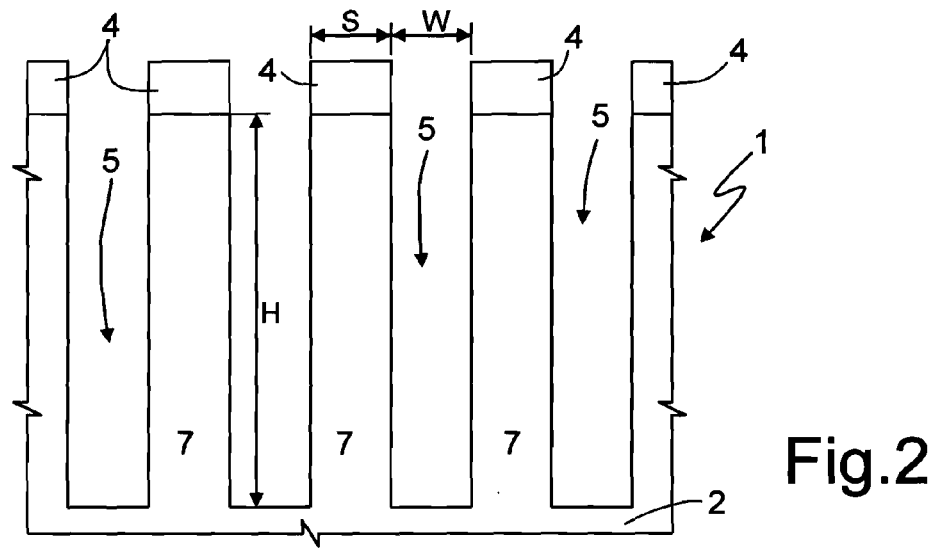

Next, the substrate 2 is etched anisotropically, for example through an STS etch, and deep trenches 5 are opened at the regions left uncovered by the mask 4, as shown in FIG. 2. In greater detail, the deep trenches 5 are substantially rectilinear and extend parallel to each other in a direction perpendicular to the drawing plane. All the deep trenches 5 have a initial height H and a same initial width W, and are separated from one another by a wall 7 having an initial width S. The initial width W of the deep trenches 5 is substantially equal to the initial width S of the walls 7 (for example, 1 μm), while the initial depth H is much greater; preferably the ratio between the initial depth H and the initial width W is not smaller than 5.

Figure 3:
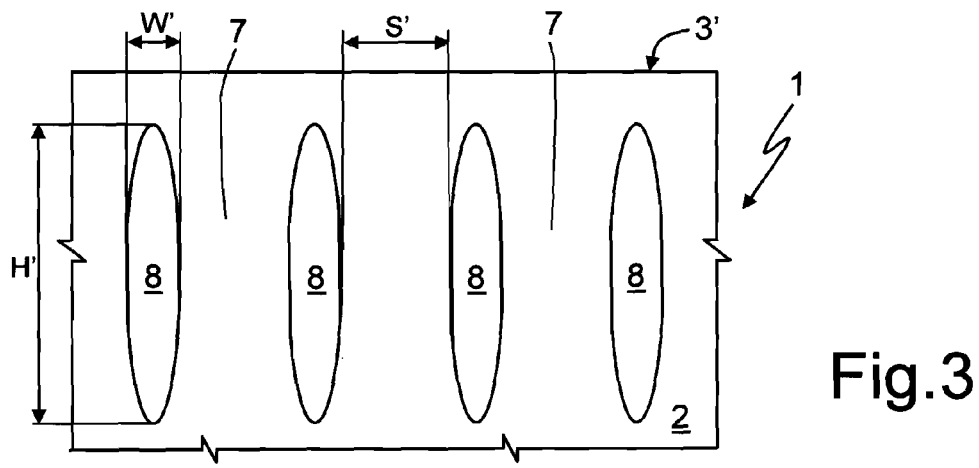

Next, mask 4 is removed, and an epitaxial growth is performed (FIG. 3). The silicon grows by a controlled amount on top of the face 3 of the wafer 1 and expands laterally until it closes the entrances of the deep trenches 5, thus practically forming buried channels 8 embedded in the wafer 1 and completely surrounded by silicon. In an initial stage of the epitaxial growth, silicon grows also inside the deep trenches 5, before the latter are closed at the top. Consequently, the buried channels 8 have cross sections that are substantially oval and elongated in a direction perpendicular to the surface 3' of the wafer 1. In particular, the buried channels 8 have an intermediate width W' and an intermediate height H', which are respectively smaller than the initial width W and the initial height S of the deep trenches 5. The intermediate width S' of the walls 7 is instead increased with respect to the initial width S (for example, the buried channels 8 have an intermediate width W' of 0.5 μm and an intermediate height H' of 3 μm, and the partition walls 7 have an intermediate width S' of 1.5 μm). In addition, the buried channels 8 house the same atmosphere in which the wafer 1 is immersed when the epitaxial growth is performed. In particular, this atmosphere has a high hydrogen concentration and is deoxidizing.

Figure 4:
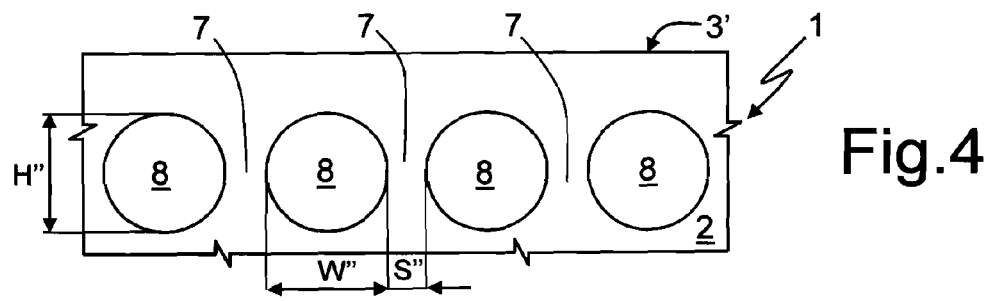

As shown in FIG. 4, the cross section of the buried channels 8 is subsequently modified by a thermal annealing process having a controlled duration. For example, the wafer 1 is heated to 1150° C. for 5 hours. In this step there is no removal of silicon. In practice, when the wafer 1 is heated in a deoxidizing atmosphere, the superficial silicon atoms around the buried channels 8 migrate and tend to assume minimum energy distributions, as explained in the article "A New Substrate Engineering for the Formation of Empty Space in Silicon (ESS) Induced by Silicon Surface Migration" by T. Sato, N. Aoki, I. Mizushima, and Y. Tsunashima, IEDM 1999, pp. 517-520. In greater detail, the buried channels 8, which initially have an oval cross section, tend to assume a substantially circular cross section. At the end of the annealing step, then, the buried channels 8 have a final height H" and a final width W" which are approximately equal to one another (for example, 1.5 μm), and the partition walls 7 are thinned out to reach a final width S" smaller than the initial width S (for example, 0.5 μm).

Figure 5:
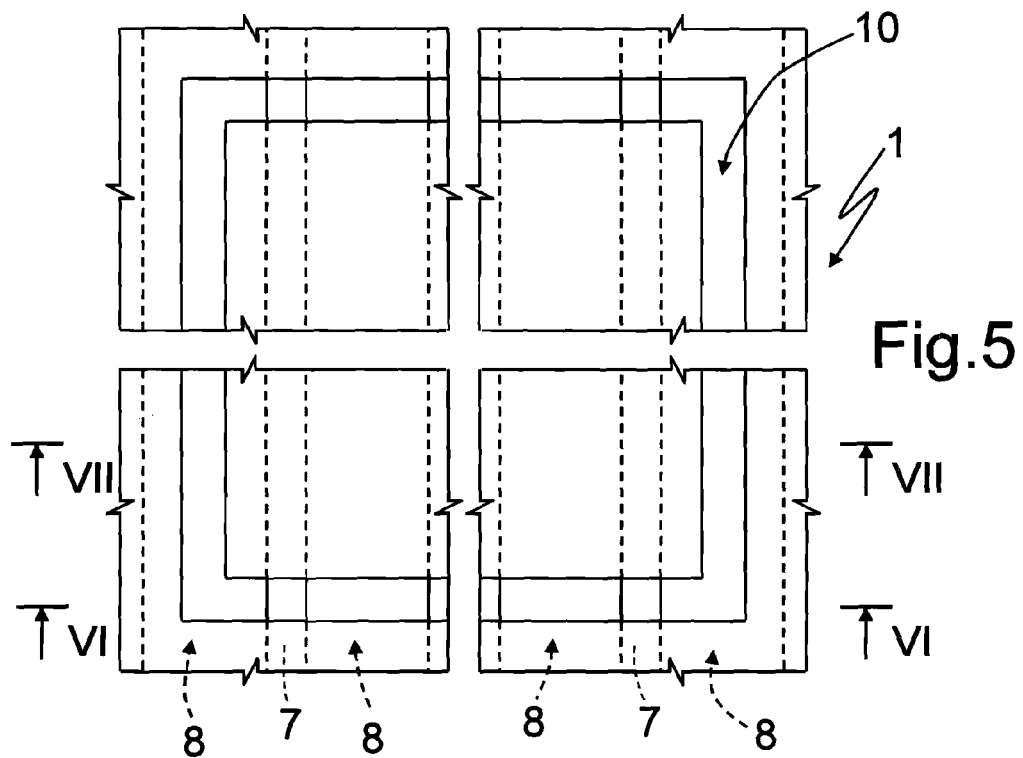
FIG. 5 is a top plan view of the wafer of FIG. 4.
Figure 6:
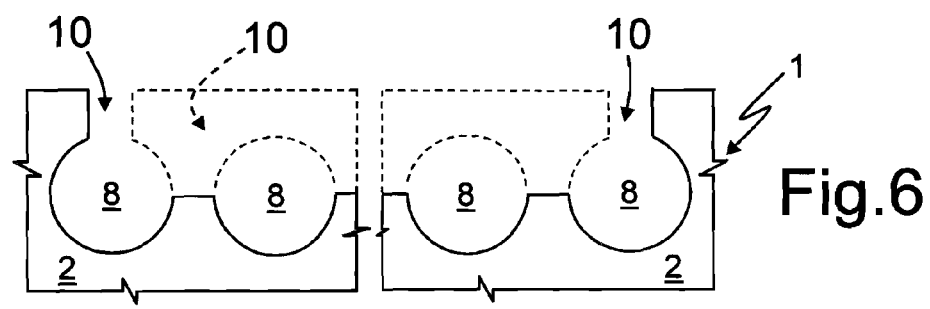
FIG. 6 is a cross-sectional view of the wafer of FIG. 5 according to line VI-VI.
Figure 7:
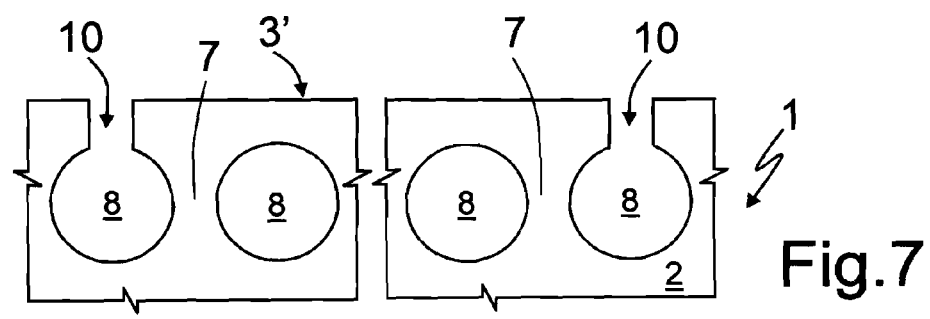
FIGS. 7-10 are a cross-sectional views of the wafer of FIG. 5 according to line VII-VII, in successive manufacturing steps.

After annealing, a second masked trench etching is performed to open in the wafer 1 at least one connection trench 10 having a depth such as to reach all the buried channels 8 and a width greater than the final width S" of the partition walls 7 (for example, 1 μm). Preferably, the connection trench 10 extends along a closed line and delimits an insulated monocrystalline silicon region 11, intended to subsequently form an active area for accommodating integrated components (FIGS. 5-7).

Figure 8:
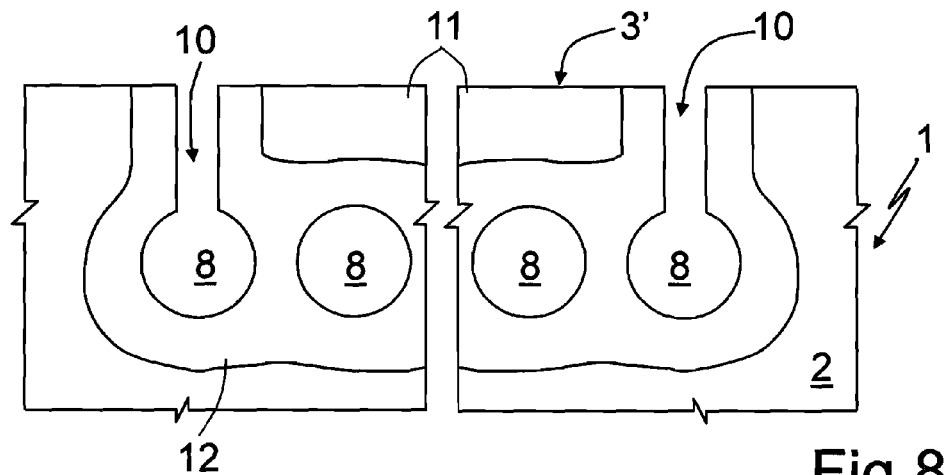

Next, thermal oxidation of the partition walls 7 and of the walls of the connection trench 10 is carried out so as to form a silicon dioxide insulating region 12. The oxygen required is fed to the buried channels 8 through the connection trench 10. In this step, the oxide regions gradually grow at the expense of the silicon regions that form the partition walls 7 and the walls of the connection trench 10. In particular, the partition walls 7 are completely oxidized, by virtue of the width reduction caused by the previous annealing step. As shown in FIG. 8, the insulating region 12 surrounds the insulated region 11 laterally and at the bottom, electrically insulating it from the substrate 2. Instead, the buried channels 8 and the connection trench 10 are partly filled with thermal oxide, but remain partially open.

Figure 9:
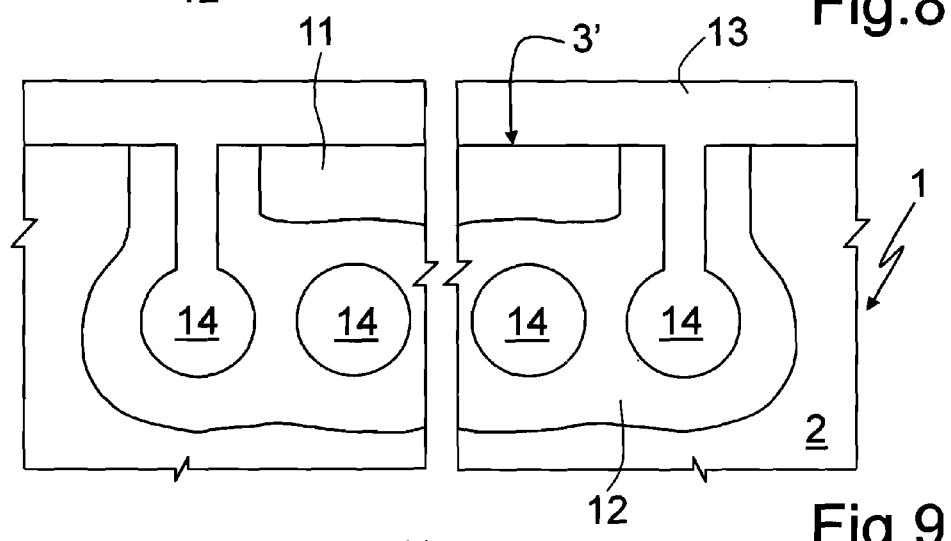

Next (FIG. 9), on the surface 3' of the wafer 1 there is deposited a layer 13 of dielectric material, for example tetraethylorthosilicate (TEOS) oxide, which penetrates through the connection trench 10 and fills the buried channels 8 and the connection trench 10, preferably completely. In practice, the deposited dielectric material forms a filling area 14 within the insulating region 12. Consequently, the insulating region 12 and the filling region 14 form an insulating structure which is compact and substantially without any cavities inside it. However, regions of very small diameter may remain unfilled, but do not significantly alter the properties of the insulating structure. In particular, in addition to electrical insulation, the substantial continuity of the insulating region 12 and of the filling region 14 ensure thermal conductivity between the insulated region 11 and the substrate 2, and thus dispersion of the heat generated in the devices made in the wafer 1. The layer 13 of dielectric material is then removed.

Figure 10:
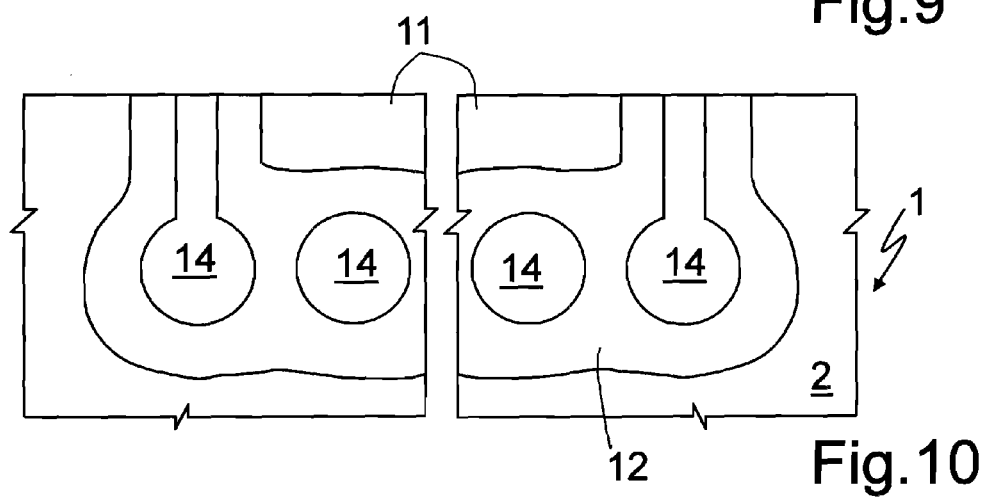
Figure 11:
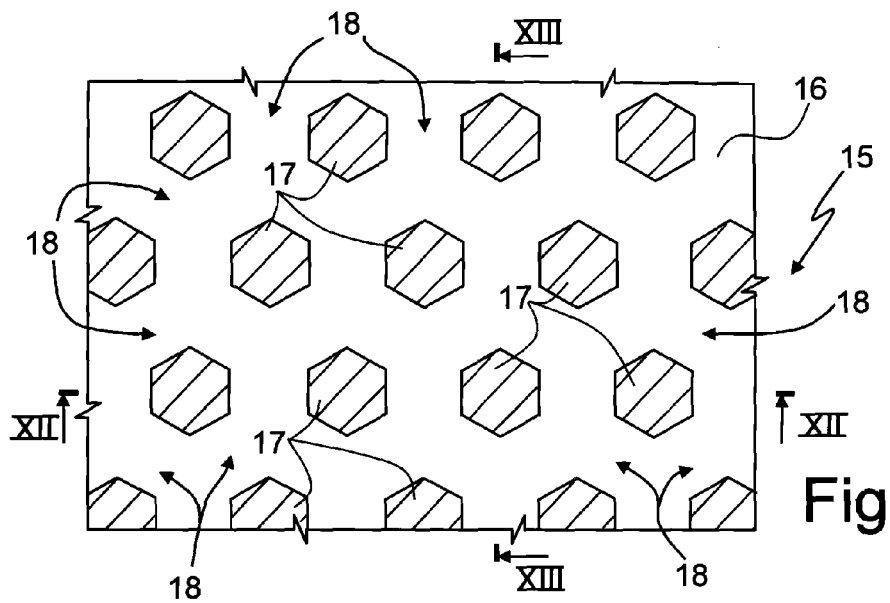
FIG. 11 is a top plan view of a wafer of semiconductor material in an initial manufacturing step according to a different embodiment of the disclosure.
Figure 12:
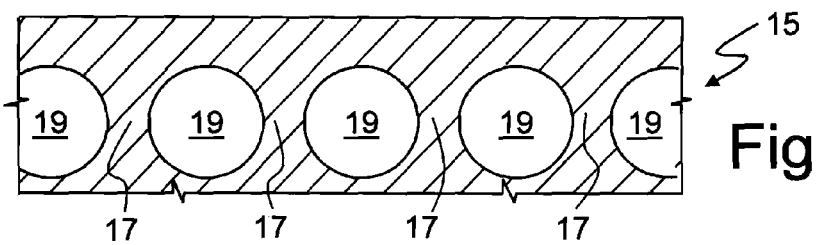
FIGS. 12 and 13 are cross-sectional views of the wafer of FIG. 11 according to lines XII-XII and XIII-XIII, respectively.

The wafer 1 of FIG. 10 is thus obtained, wherein the SOI-type structure can be clearly recognized. In particular, FIG. 10 shows the insulated region 11 and the substrate 2 separated from one another by the insulating region 12 and the filling region 14. The substrate 2, which has a larger width, mainly performs the functions of support and heat dissipation, while inside the insulated region 11, which is thin, it is possible to form active and passive integrated devices according to any known process.

According to a different embodiment of the disclosure, shown in FIGS. 11-14, silicon columns 17 are initially formed in a substrate 16 of a semiconductor wafer 15, the silicon columns 17 preferably having a hexagonal shape in plan view and being organized in honeycomb fashion to obtain maximum packing. To this aim, silicon is selectively removed by trench etching, and communicating trenches 18 are formed, which delimit the columns 17. In practice, the communicating trenches 18 are coupled together so as to form a hollow region having a complex shape, in which the columns 17 extend.

Figure 13:
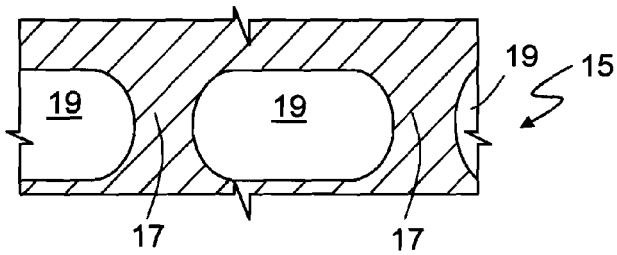
Figure 14:
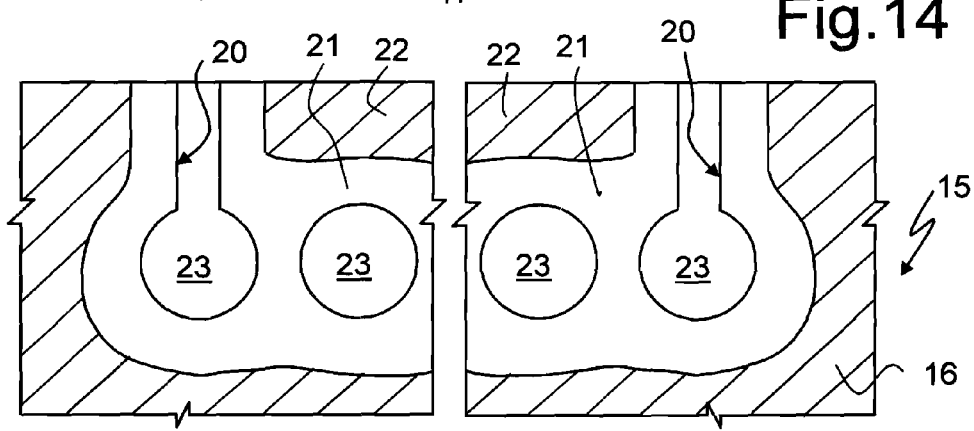
FIG. 14 presents the same view as in FIG. 12 in a subsequent manufacturing step of the wafer.

Next, epitaxial growth and annealing are carried out, as above described. In particular, during the epitaxial growth, the deep trenches 18 are closed, and a deep cavity 19 is formed, while during annealing, the columns 17 are thinned out in a central portion, thus assuming an hourglass shape (FIG. 13).

The process is then completed as previously described. In particular, a connection trench 20 is opened, the columns 17 are completely oxidized so as to form an insulating region 21 which delimits an insulated silicon region 22, and the buried cavity 19 is filled with TEOS oxide, thus forming filling regions 23.

The process described herein is extremely simple, at the same time it enables manufacturing of SOI wafers that are free from crystallographic defects. In fact, the required processing steps are not so numerous as in known processes and can be easily included in standard processes for manufacturing integrated devices.

Particularly advantageous is the use of the annealing step, which, according to the described embodiments of the disclosure, is performed instead of isotropic etching previously used for widening the trenches. The formation of structures, such as walls or columns, delimited by cavities and embedded in the silicon is in itself simple, in so far as it requires only one masked trench etch and one epitaxial growth. The subsequent annealing step allows the surfaces of the buried cavities (buried channels 8 and buried cavity 19) to be modified, widening the latter and reducing the width of the silicon structures (partition walls 7 and columns 17), so that the silicon structures can then be oxidized. The surface of the wafer is not, however, involved and thus does not have to be protected; consequently, all the steps for forming and removing hard masks are eliminated. Also the need for the inhibiting layer is overcome: since the annealing follows epitaxial growth, forming silicon inside the deep trenches 5 (or the communicating trenches 18) is within bearable limits, provided that these deep trenches are not filled completely.

In addition, the atmosphere entrapped inside the buried cavities is the same as used for the epitaxial growth, namely an atmosphere with a high hydrogen concentration. In practice, the annealing step, which normally requires the use of a hydrogen oven, can be performed using a standard thermal process. Furthermore, with a single thermal process it is possible to carry out both annealing and other manufacturing steps that are normally envisaged for manufacturing components and/or integrated circuits; for example, annealing could be carried out simultaneously with the diffusion of a previously implanted doping species.

Finally, it is clear that numerous modifications and variations may be made to the process described and illustrated herein, all falling within the scope of the disclosure, as defined in the attached claims.

In particular, the process can be used for selectively insulating portions of the wafer. Alternatively, the insulating region may extend throughout the wafer.

Annealing could be carried out even before epitaxial growth. In this case, however, it would be necessary to use a hydrogen oven.

Furthermore, the initial shape of the trenches may be different from the shapes shown herein.

What is claimed is:

1. A method, comprising:
   forming an opening in a region of a semiconductor layer;
   forming an epitaxial layer on the semiconductor layer;
   converting the opening into a cavity encapsulated by semiconductor material during the forming of the epitaxial layer; and
   annealing the region.

2. The method of claim 1 wherein forming an opening includes removing material.

3. The method of claim 1 wherein forming an epitaxial layer further comprises:
   closing the opening to form the cavity, and
   annealing the region after closing the opening.

4. The method of claim 3 wherein:
   after forming the epitaxial layer but before annealing the region, the cavity has a first shape, and
   after annealing the region, the cavity has a second shape that is different than the first shape.

5. The method of claim 3 wherein forming the epitaxial layer includes growing the layer in a deoxidizing atmosphere.

6. The method of claim 3 wherein forming the epitaxial layer includes growing the layer in an atmosphere having a high concentration of hydrogen.

7. The method of claim 1 wherein annealing the region includes annealing the region in a deoxidizing atmosphere.

8. The method of claim 1 further comprising disposing a circuit component in the region and adjacent the cavity, the component operable to generate a signal.

9. A method, comprising:
   forming an opening in a region of a semiconductor layer;
   growing an epitaxial layer on the semiconductor layer such that a cavity having a first shape is formed in the semiconductor layer; and
   annealing the region to change the first shape of the cavity to a second shape.

10. The method of claim 9, further comprising etching a second opening after annealing the region, the second opening exposing the cavity.

11. The method of claim 9, further comprising growing the epitaxial layer such that the cavity formed comprises the first shape having a substantially oval cross-section.

12. The method of claim 9, further comprising annealing the region such that the cavity comprises the second shape having a substantially circular cross-section.

13. A method, comprising:
    forming a plurality of openings in a region of a semiconductor layer;
    growing an epitaxial layer on the semiconductor layer such that a plurality of cavities are formed in the semiconductor layer, each cavity aligned with a respective one of the plurality of openings; and
    annealing the region.

14. The method of claim 13, further comprising etching a second opening after annealing the region, the second opening exposing at least one cavity.

15. The method of claim 13, further comprising annealing the region in a deoxidizing atmosphere having a temperature of approximately 1150 degrees Celsius.

16. The method of claim 13, wherein the first shape comprises a substantially oval cross-section.

17. The method of claim 13, wherein the second shape comprises a substantially circular cross-section.

* * * * *